United States Patent
Park et al.

(10) Patent No.: US 11,962,966 B2
(45) Date of Patent: Apr. 16, 2024

(54) HEADSET INCLUDING IN-EAR MICROPHONE

(71) Applicant: Samsung Electronics Co., Ltd., Suwon-si (KR)

(72) Inventors: Haekeu Park, Suwon-si (KR); Kyeongcheol Yoon, Suwon-si (KR); Hyeonyeong Jeong, Suwon-si (KR); Sunghoon Cho, Suwon-si (KR); Seonmi Kim, Suwon-si (KR); Jeock Lee, Suwon-si (KR); Seyoun Kwon, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/425,538

(22) PCT Filed: Jan. 17, 2020

(86) PCT No.: PCT/KR2020/000847
§ 371 (c)(1),
(2) Date: Jul. 23, 2021

(87) PCT Pub. No.: WO2020/153666
PCT Pub. Date: Jul. 30, 2020

(65) Prior Publication Data
US 2024/0031727 A1    Jan. 25, 2024

(30) Foreign Application Priority Data
Jan. 23, 2019 (KR) .................. 10-2019-0008773

(51) Int. Cl.
*H04R 1/10* (2006.01)

(52) U.S. Cl.
CPC ......... *H04R 1/1075* (2013.01); *H04R 1/1016* (2013.01); *H04R 1/1041* (2013.01); *H04R 2400/11* (2013.01)

(58) Field of Classification Search
CPC .. H04R 1/1075; H04R 1/1016; H04R 1/1041; H04R 2400/11
(Continued)

(56) References Cited

U.S. PATENT DOCUMENTS 9,934,774 B1 *  4/2018 Lin .................. G10K 11/17857
2014/0205131 A1  7/2014 Azmi et al.
(Continued)

FOREIGN PATENT DOCUMENTS

JP   2015-089011    5/2015
KR   10-2017-0030375   3/2017

OTHER PUBLICATIONS

Office Action dated Aug. 30, 2023 in KR Application No. 10-2019-0008773 and English-language translation.
(Continued)

*Primary Examiner* — Vivian C Chin
*Assistant Examiner* — Con P Tran
(74) *Attorney, Agent, or Firm* — Nixon & Vanderhye, P.C.

(57) ABSTRACT

A headset including an in-ear microphone is disclosed, the headset including a first frame including a first surface toward a first direction, a second surface toward a second direction opposite to the first direction, and a side surface surrounding at least part of a space between the first surface and the second surface, a speaker seating portion formed by recessing by a specific depth from a first portion of the first surface toward the second surface, a space formed between the speaker seating portion and the second surface, a speaker hole penetrated from the speaker seating portion to the
(Continued)

space, a microphone hole penetrated from a second portion of the first surface to the space, an acoustic hole formed by penetrating the second surface from the space, a speaker seated in the speaker seating portion, a first printed circuit board disposed on the second portion and having a via hole connected with the microphone hole, a second printed circuit board electrically connected with the first printed circuit board and a connection unit of the speaker, and a microphone mounted at a position aligned with the via hole on the first printed circuit board. Various other embodiments identified in this document are also possible.

20 Claims, 8 Drawing Sheets

(58) Field of Classification Search
USPC ..... 381/74, 87, 150, 122, 111, 91, 355, 165; 455/73; 429/493; 361/761, 748; 427/96.1
See application file for complete search history.

(56) References Cited

U.S. PATENT DOCUMENTS

| | | | |
|---|---|---|---|
| 2015/0023542 A1* | 1/2015 | Shimizu | H04R 1/1075 381/380 |
| 2016/0050474 A1* | 2/2016 | Rye | H05K 7/1427 381/152 |
| 2016/0142806 A1* | 5/2016 | Lee | H04R 1/1016 381/375 |
| 2017/0346920 A1 | 11/2017 | Masaki et al. | |

OTHER PUBLICATIONS

Office Action dated Mar. 21, 2023 in KR Application No. 10-2019-0008773 and English-language translation.
Extended Search Report dated Jan. 18, 2022 in European Application No. 20744845.7.

* cited by examiner

HEADSET INCLUDING IN-EAR MICROPHONE

This application is the U.S. national phase of International Application No. PCT/KR2020/000847 filed Jan. 17, 2020 which designated the U.S. and claims priority to KR Patent Application No. 10-2019-0008773 filed Jan. 23, 2019, the entire contents of each of which are hereby incorporated by reference.

TECHNICAL FIELD

Various embodiments of the present invention relate to a headset including an in-ear microphone.

BACKGROUND ART

A headset may support a user in enjoying music or video by herself/himself, without disturbing others. Such a headset may include a speaker for outputting a sound and a microphone for receiving a user's voice. For example, the user wearing the headset may listen to a sound of music or video outputted through the speaker of the headset, and input voice using the microphone of the headset.

DISCLOSURE OF INVENTION

Technical Problem

A headset including a conventional in-ear microphone may include a partition for separating an acoustic passage (a path of an output sound) of a speaker and an acoustic passage (a path of a received sound) of a microphone to improve sound collecting performance of the microphone. Hence, each acoustic passage has a small cross-sectional area and may be easily blocked by a foreign substance, and a volume of the acoustic passage of the speaker is small and may cause a problem of deteriorating frequency output characteristics of mid and high ranges of the speaker.

In addition, the headset including the conventional in-ear microphone, which individually assembles the speaker and the microphone inside a housing of the headset, may have engineering tolerance (assembly variation) due to the assembly, and deteriorate productivity (mass productivity) of the headset.

Various embodiments of the present invention may provide a headset including an in-ear microphone in which an acoustic passage of a speaker and an acoustic passage of a microphone are connected.

In addition, various embodiments of the present invention may provide a headset including an in-ear microphone in which a speaker and a microphone are formed as an integral module.

Solution to Problem

A headset including an in-ear microphone according to various embodiments of the present disclosure, may include a first frame including a first surface toward a first direction, a second surface toward a second direction opposite to the first direction, and a side surface surrounding at least part of a space between the first surface and the second surface, a speaker seating portion formed by recessing by a specific depth from a first portion of the first surface toward the second surface, a space formed between the speaker seating portion and the second surface, a speaker hole penetrated from the speaker seating portion to the space, a microphone hole penetrated from a second portion of the first surface to the space, an acoustic hole formed by penetrating the second surface from the space, a speaker seated in the speaker seating portion, a first printed circuit board disposed on the second portion and having a via hole connected with the microphone hole, a second printed circuit board electrically connected with the first printed circuit board and a connection unit of the speaker, and a microphone mounted at a position aligned with the via hole on the first printed circuit board.

In addition, a headset including an in-ear microphone according to various embodiments of the present invention, may include a housing, a seating portion including an external hole which protrudes outwards from a surface of the housing and penetrates from the surface of the housing to the protruding end surface, a first frame inserted and seated in the seating portion and including a first surface toward a first direction, a second surface toward a second direction opposite to the first direction, and a side surface surrounding at least part of a space between the first surface and the second surface, a speaker seating portion formed by recessing by a specific depth from a first portion of the first surface toward the second surface, a space formed between a lower end of an inner surface of the seating portion facing the second surface and the second surface with the first frame seated, a speaker hole formed by penetrating from the speaker seating portion to the space through the second surface, a microphone hole penetrated from a second portion of the first surface to the space, an acoustic hole formed by penetrating the inner surface of the seating portion from the space and connecting with the external hole, a speaker seated in the speaker seating portion, a first printed circuit board disposed on the second portion and having a via hole connected with the microphone hole, a second printed circuit board electrically connected with the first printed circuit board and a connection unit of the speaker, and a microphone mounted at a position aligned with the via hole on the first printed circuit board.

Advantageous Effects of Invention

According to various embodiments of the present invention, since an acoustic passage of a speaker and an acoustic passage of a microphone are connected, a cross-sectional area of the acoustic passage increases to reduce a clogging phenomenon due to a foreign substance, and a connected space may be utilized as a resonance space of the speaker to improve mid and high range frequency output characteristics of the speaker.

In addition, according to various embodiments of the present invention, since a speaker and a microphone are formed as an integral module, engineering tolerance (assembly variation) occurring in assembly may be reduced to improv productivity (mass productivity) of a headset.

Besides, various effects directly or indirectly identified through this document may be provided.

BRIEF DESCRIPTION OF DRAWINGS

In connection with descriptions of the drawings, the same or similar reference numerals may be used for the same or similar components.

BEST MODE FOR CARRYING OUT THE INVENTION

Figure 1:
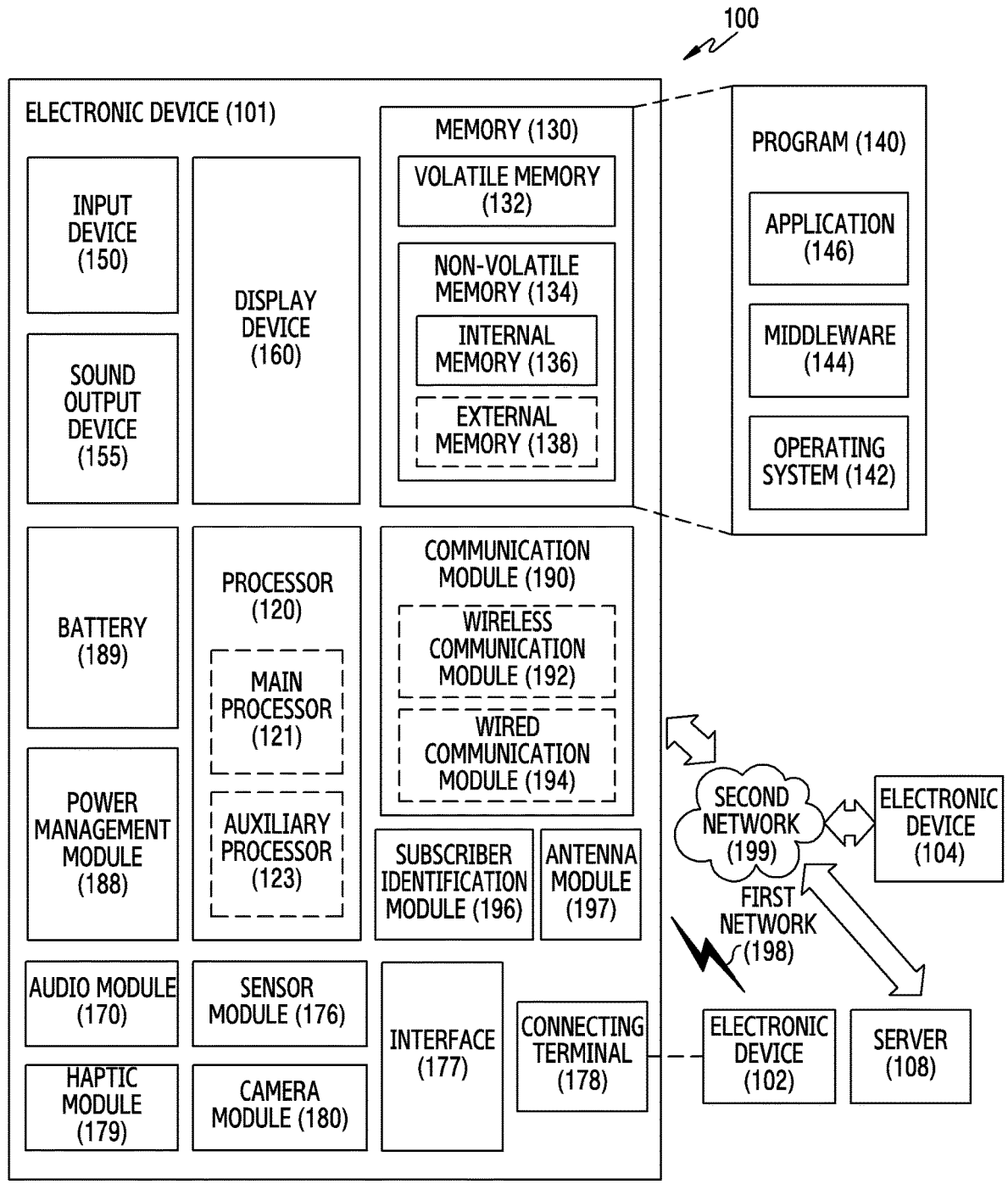
FIG. 1 is a block diagram of an electronic device in a network environment according to various embodiments.

Hereinafter, various embodiments of the present invention are described with reference to the accompanying drawings. For convenience of descriptions, the components illustrated in the drawings may be exaggerated or reduced in size, and the disclosure is not necessarily limited to the illustrated ones.

FIG. 1 is a block diagram illustrating an electronic device 101 in a network environment 100 according to various embodiments.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module(SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., PCB). According to an embodiment, the antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

Figure 2:
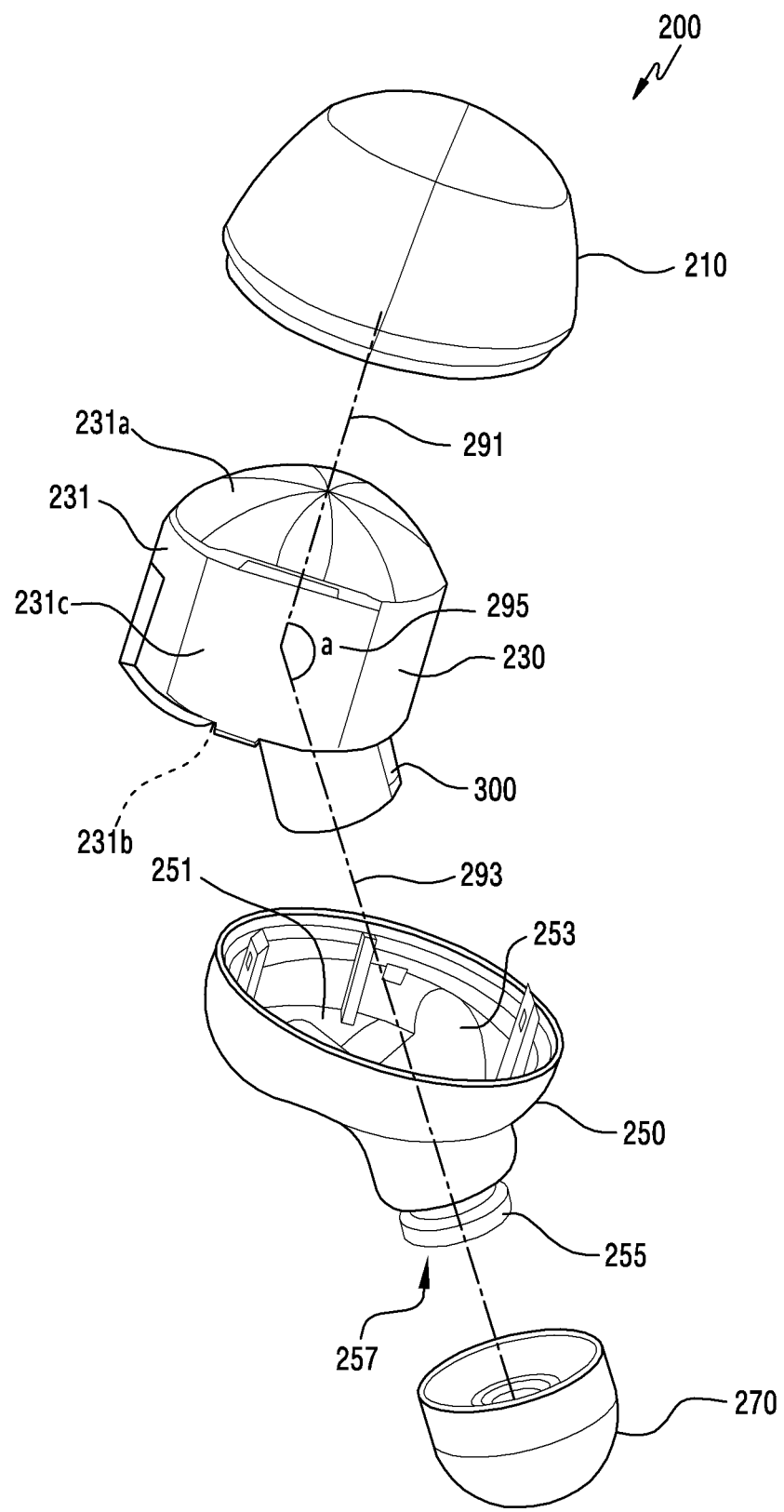
FIG. 2 is an exploded perspective view of a headset according to an embodiment of the present invention.

FIG. 2 is an exploded perspective view of a headset according to an embodiment of the present invention.

Referring to FIG. 2, a headset 200 (e.g., the electronic device 101) is a wearable electronic device worn on a user's ear, and may output a sound of music or a video or receive and process a user's voice. According to an embodiment, the headset 200 may be a stand-alone electronic device which may operate on its own or an interaction-type electronic device which operates in association with an external electronic device (e.g., the electronic device 102 or the electronic device 104). For example, the stand-alone headset 200 may play music or video on its own and output its sound or receive and process a user's voice, and the interactive-type headset 200 may be paired with the external electronic device such as a smart phone through a communication scheme such as Bluetooth to convert data received from the external electronic device and output a sound or to receive and transmit the user's voice to the external electronic device.

The headset 200 for performing the above-described functions may include housings 210 and 250, a sound processing module 230, a sound input/output module 300, and an ear cap 270. However, the configuration of the headset 200 is not limited thereto. According to various embodiments, the headset 200 may omit at least one of the above-described components, and may further include at least one other component.

The housings 210 and 250 include seating portions 251 and 253 for seating various electronic components, and may cover the electronic components seated on the seating portions 251 and 253 to protect the electronic components from outside. For example, if the sound processing module 230 and the sound input/output module 300 are seated between the first housing 210 and the second housing 250, the first housing 210 and the second housing 250 may be coupled to cover the sound processing module 230 and the sound input/output module 300. If the headset 200 is worn, the first housing 210 may be exposed to the outside, and the second housing 250 may be inserted in part into the user's ear.

The first housing 210 may include a front surface, a rear surface, and a side surface which at least partially surrounds a space between the front surface and the rear surface. Part of the rear surface of the first housing 210 may be opened such that the first housing 210 covers the sound processing module 230 and the sound input/output module 300 from above.

The second housing 250 may include a front surface, a rear surface, and a side surface which at least partially surrounds a space between the front surface and the rear surface. Part of the front surface of the second housing 250 may be opened such that the second housing 250 covers the sound processing module 230 and the sound input/output module 300 from below.

According to an embodiment, the second housing 250 may include a first seating portion 251 for receiving the sound processing module 230 and a second seating portion 253 for receiving the sound input/output module 300. The first seating portion 251 may be formed by recessing by a specific depth from the front surface of the second housing 250 toward the rear surface of the second housing 250. The second seating portion 253 may be formed by penetrating the rear surface of the second housing 250 from the first seating portion 251. According to an embodiment, the second seating portion 253 may be provided in a hollow cylindrical shape, a first portion of the second seating portion 253 may be connected with the first seating portion 251, and a second portion of the second seating portion 253 may protrude outward from the rear surface of the second housing 250. In addition, the second seating portion 253 may include an external hole 257 which penetrates from an end surface where the first portion is connected with the first seating portion 251 to an end surface where the second portion protrudes outwards. Hence, if the sound input/output module 300 is inserted and seated inside the second seating portion 253, an acoustic passage of the sound input/output module 300 may be connected through the external hole 257.

According to an embodiment, the second housing 250 may include a fastening unit 255 for fastening the ear cap 270. For example, the fastening unit 255 may be formed at an end where the second portion of the second seating portion 253 protrudes outwards. The fastening unit 255 may be provided in a shape in which an outer surface of the second portion protrudes outwards, or in a shape in which the outer surface of the second portion is recessed inwards. For example, if the ear cap 270 is fastened, the fastening unit 255 may be provided such that the ear cap 270 is caught at a side wall of a protrusion or a recess of the fastening unit 255 and does not easily escape from the fastening unit 255.

The sound processing module 230 may include electronic components for processing a sound signal inputted from the sound input/output module 300 and a sound signal to be outputted to the outside through the sound input/output module 300. The sound processing module 230 may include, for example, a memory (e.g., the memory 130) and a processor (e.g., the processor 120). However, the configuration of the sound processing module 230 is not limited thereto. According to various embodiments, the sound processing module 230 may further include at least one other component in addition to the above-described components. For example, the sound processing module 230 may further include a communication module (e.g., the communication module 190) for communicating with an external electronic device, a battery (e.g., the battery 189), and the like.

According to an embodiment, the sound processing module 230 may include a first frame 231 including a front surface 231a, a rear surface 231b, and a side surface 231c which surrounds at least part of a space between the front surface 231a and the rear surface 231b. A hollow space is formed inside the first frame 231, and electronic components may be seated in the hollow space. According to an embodiment, the front surface 231a of the first frame 231 may be provided in a dome shape.

The sound input/output module 300 may include a speaker (330 of FIG. 3 through FIG. 6) (e.g., the sound output device 155) for outputting the sound signal received from the sound processing module 230 to the external hole 257 and a microphone (370 in FIG. 3 through FIG. 6) (e.g., the input device 150) for receiving a sound signal from the external hole 257.

In general, the microphone included in the headset may be divided into an out-ear type and an in-ear type. In the out-ear microphone, the microphone may be positioned near a user's mouth through a microphone boom or a directional microphone may be disposed toward the user's mouth. Ambient noise is mixed with a user's voice, and the out-ear microphone may be subject to the noise. Hence, various embodiments of the present invention will describe the headset 200 including the in-ear microphone. If the headset 200 is worn, the in-ear microphone is inserted into a user's ear canal together with the speaker, and if a voice generated from a user's vocal cord is transmitted to the ear canal through an oral cavity, an eardrum, and the like, it may collect and convert it into an electrical signal. Thus, the in-ear microphone may more efficiently acquire the voice transmitted through the ear canal in closer contact with the user's ear canal, and block external noise.

The sound input/output module 300 may include a second frame (310 of FIG. 3 through FIG. 6) for integrally forming the speaker and the microphone. For example, in a manufacturing process of the headset 300, the speaker and the microphone are seated on the second frame, and then the second frame is inserted and seated on the second seating portion 253, thus installing the speaker and the microphone in the headset 300. If the speaker and the microphone are integrally installed on the headset 300 through the second frame, productivity (mass productivity) of the headset 300 may be improved by relatively reducing engineering tolerance (assembly variation) compared with the speaker and the microphone separately installed inside the housings 210 and 250 of the headset 300.

According to an embodiment, the first frame 231 of the sound processing module 230 and the second frame (310 of FIG. 3 through FIG. 6) of the sound input/output module 300 may be coupled slantly, to thus fit into a shape of the ear if the headset 200 is worn on the user's ear. For example, the first frame 231 and the second frame may be coupled such that a central axis 291 of the first frame 231 and a central axis 293 of the second frame make a designated angle a 295. The designated angle 295 may include, for example, an acute angle.

The ear cap 270 may cover and protect part of the second housing 250 inserted into the user's ear. According to an embodiment, the ear cap 270 may be provided with a flexible material. Hence, if the user wears the headset 200, it may provide comfortable fit to the user.

Figure 3:
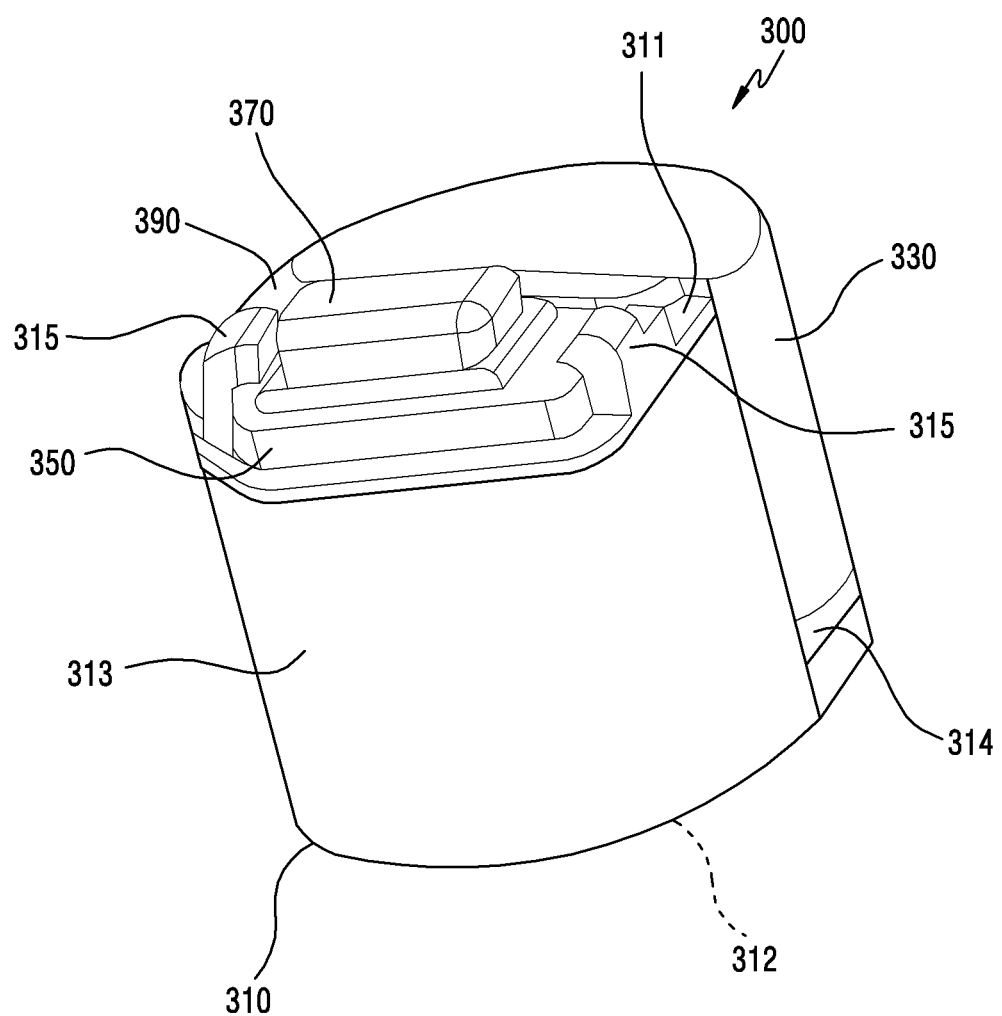
FIG. 3 is a perspective view of a sound input/output module of a first aspect in which a speaker and a microphone are integrally formed according to an embodiment of the present invention.
Figure 4:
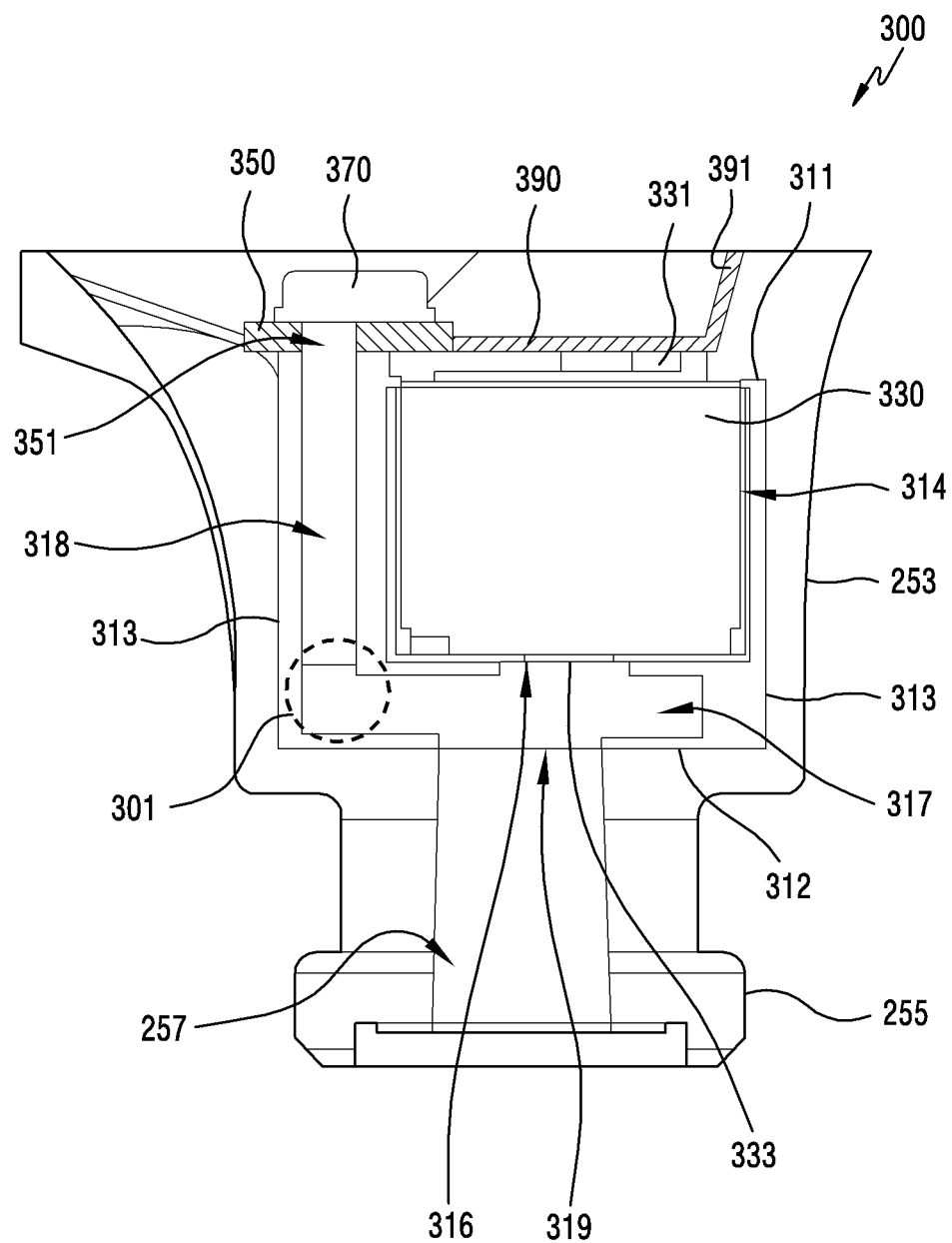
FIG. 4 is a cross-sectional view of a sound input/output module of FIG. 3 according to an embodiment of the present invention.

FIG. 3 is a perspective view of a sound input/output module of a first aspect in which a speaker and a microphone are integrally formed according to an embodiment of the present invention, and FIG. 4 is a cross-sectional view of a sound input/output module of FIG. 3 according to an embodiment of the present invention.

Referring to FIG. 3 and FIG. 4, a sound input/output module 300 may include a frame 310, a speaker 330, a first printed circuit board 350, a microphone 370, and a second printed circuit board 390. The frame 310 may include a front surface 311, a rear surface 312, and a side surface 313 surrounding at least part of a space between the front surface 311 and the rear surface 312. In addition, the frame 310 may include a speaker seating portion 314 recessed by a specific depth from a first portion of the front side 311 toward the rear side 312. According to an embodiment, the speaker seating portion 314 may be formed in a cylindrical shape.

The frame 310 may include a space 317 formed between the speaker seating portion 314 and the rear surface 312, a speaker hole 316 penetrating from the speaker seating portion 314 to the space 317, a microphone hole 318 penetrating from a second portion of the front surface 311 (a portion excluding the first portion of the front surface 311 where the speaker seating portion 314 is formed) to the space 317, and an acoustic hole 319 penetrating the rear surface 312 from the space 317 and connecting with the external hole 257. The space 317 may be formed to be long from an inner side of one side surface of the frame 310 to an inner side of the other side surface. For example, a height of the space 317 may correspond to a distance between the speaker seating portion 314 and the rear 312, and a lateral length of the space 317 may be shorter than a width of the frame 310 (a distance between the one side surface and the other side surface of the frame 310) and longer than a horizontal distance between the microphone hole 318 and the speaker hole 316.

The speaker hole 316 may be formed by penetrating through the speaker seating portion 314 at a position aligned with an output unit 333 of the speaker 330. The speaker hole 316 may form an acoustic passage (a path of an output sound) of the speaker 330 together with the space 317. For example, a sound outputted through the output unit 333 of the speaker 330 may resonate in the space 317 after passing through the speaker hole 316. Hence, mid- and high-range frequency output characteristics of the speaker 330 may be improved in response to a volume of the space 317.

The microphone hole 318 may be spaced from the speaker seating portion 314 by a specific distance and formed in parallel to the one side surface of the speaker seating portion 314. The microphone hole 318 may connect with a via hole 351 formed in the first printed circuit board 350. For example, the microphone hole 318 may form an acoustic passage (a path of a received sound) of the microphone 370 together with the via hole 351 and the space 317. In addition, the microphone hole 318 and the speaker hole 316, which are not separated by a partition, are connected with the space 317 and connected with the external hole 257 through the acoustic hole 319 connecting with the space 317, thus reducing a clogging phenomenon due to a foreign substance introduced from the outside.

According to an embodiment, a portion 301 in which the microphone hole 318 and the space 317 are connected may have a bent shape. For example, the microphone hole 318 may not be placed on a straight line with the acoustic hole 319. In more detail, a horizontal distance between a central axis of the microphone hole 318 and a central axis of the acoustic hole 319 may be greater than a sum of a radius of the microphone hole 318 and a radius of the acoustic hole 319. This structure is a structure in which the microphone hole 318 is disposed as close as possible to the side surface of the frame 310, and may be a structure for securing the space 317 as much as possible. The microphone 370 may have frequency characteristics of the mid and low ranges. Sound pickup performance may not be significantly degraded even if the sound introduced through the acoustic hole 319 is received at the microphone 370 through the bent connected portion 301 of the microphone hole 318 and the space 317. In addition, since the microphone hole 318 is disposed as close as possible to the side surface of the frame 310, the volume of the space 317 may increase, and the mid- and high-range frequency output characteristics of the speaker 330 utilizing the space 317 as the resonance space may be improved.

The speaker 330 may convert an electrical signal received from the sound processing module 230 to a sound through the second printed circuit board 390. The speaker 330 may be seated on the speaker seating portion 314 and output the sound through the output unit 333 aligned with the speaker hole 316. According to an embodiment, the speaker 330 may be provided in a cylindrical shape. In addition, the speaker 330 may include a connection unit 331 electrically connected to the second printed circuit board 390. According to an embodiment, the connection unit 331 may be soldered to the second printed circuit board 390.

The first printed circuit board 350 may include circuitry related to signal processing of the microphone 370. The microphone 370 may be mounted on the first printed circuit board 350. For example, the via hole 351 may be formed in the first printed circuit board 350, and the microphone 370 may be mounted on a front surface of the first printed circuit board 350 at a position aligned with the via hole 351. Also, the first printed circuit board 350 may be electrically connected with the second printed circuit board 390.

According to an embodiment, the first printed circuit board 350 may be fixed to the frame 310. For example, a rear surface of the first printed circuit board 350 may be fixed to a second portion of the front surface 311 (a portion excluding a first portion of the front surface 311 in which the speaker seating portion 314 is formed) through an adhesive member (e.g., a double-sided tape). As another example, the first printed circuit board 350 may be fixed to the frame 310 through at least one hook portion 315 protruding from the second portion toward the microphone 370.

The microphone 370 may convert a sound coming through the external hole 257 into an electrical signal. For example, if a sound introduced through the external hole 257 comes to the microphone 370 via the acoustic hole 319, the space 317, the microphone hole 318, and the via hole 315, the microphone 370 may convert the received sound into an electric signal and forward the converted electrical signal to the sound processing module 230 through the first printed circuit board 350 and the second printed circuit board 390 According to an embodiment, the microphone 370 may include a micro electro mechanical system (MEMS) microphone.

The second printed circuit board 390 may electrically connect the first printed circuit board 350, the connection unit 331 of the speaker 330, and the sound processing module 230. The second printed circuit board 390 may be electrically connected to the sound processing module 230 through a connection unit 391. According to an embodiment, the second printed circuit board 390 may include a flexible printed circuit board.

Figure 5:
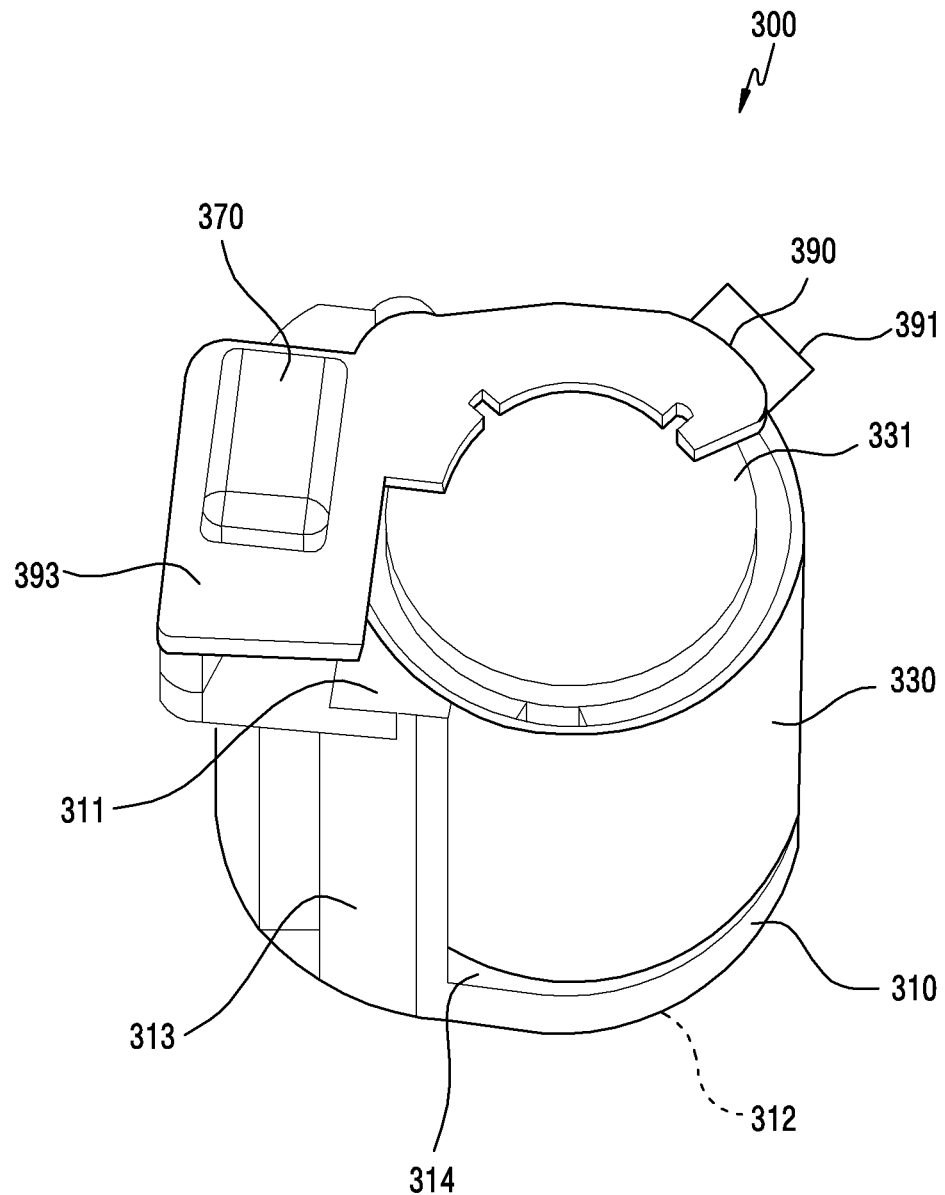
FIG. 5 is a perspective view of a sound input/output module of a second aspect in which a speaker and a microphone are integrally formed according to an embodiment of the present invention.
Figure 6:
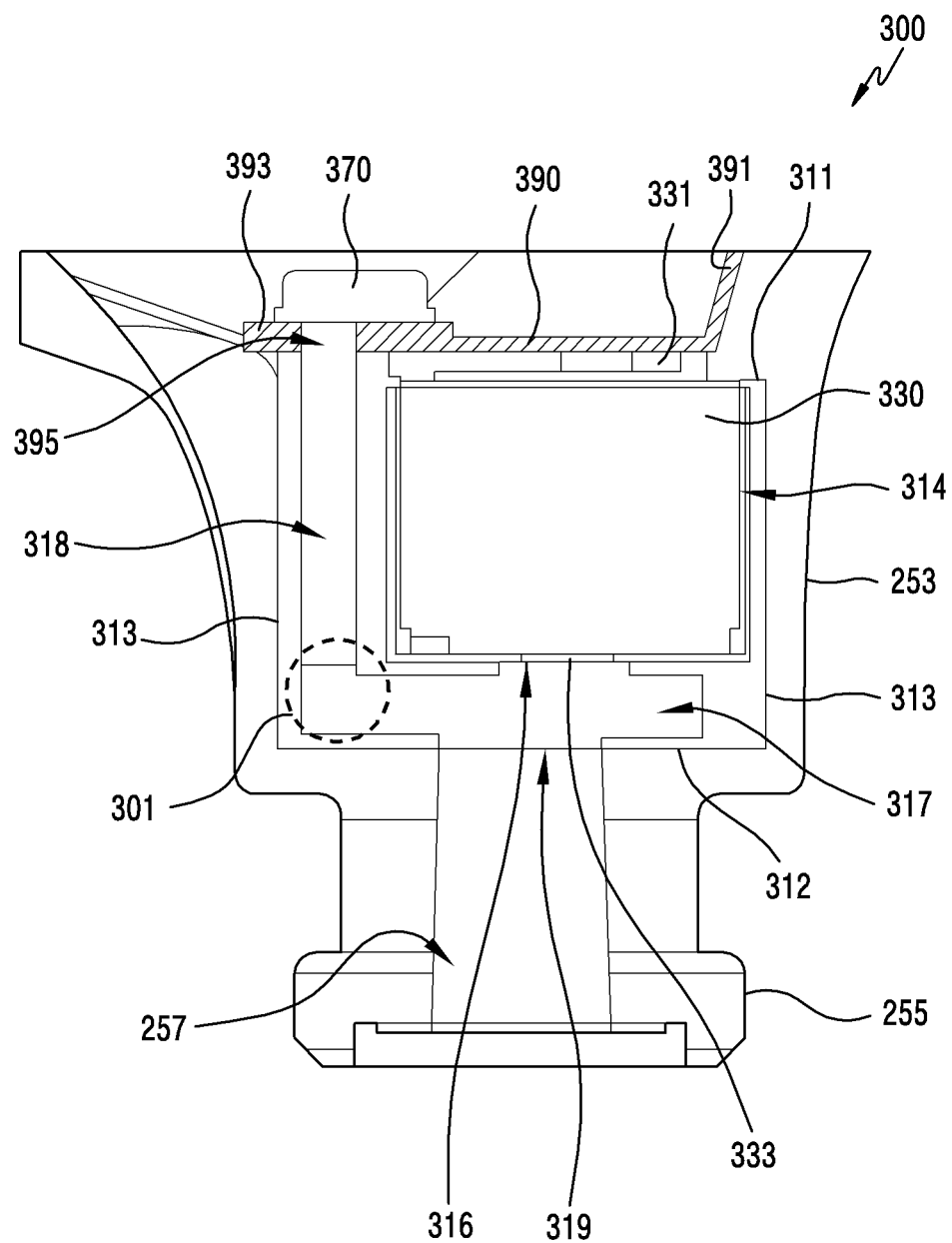
FIG. 6 is a cross-sectional view of a sound input/output module of FIG. 5 according to an embodiment of the present invention.

FIG. 5 is a perspective view of a sound input/output module of a second aspect in which a speaker and a microphone are integrally formed according to an embodiment of the present invention, and FIG. 6 is a cross-sectional view of a sound input/output module of FIG. according to an embodiment of the present invention. A sound input/output module 300 shown in FIG. 5 and FIG. 6 may have a similar configuration to the sound input/output module 300 shown in FIG. 3 and FIG. 4. Descriptions on the similar configuration to FIG. 3 and FIG. 4 will be omitted in FIG. 5 and FIG. 6.

FIG. 5 and FIG. 6, the sound input/output module 300 may include a frame 310, a speaker 330, a microphone 370, and a printed circuit board 390. The frame 310, the speaker 330, and the microphone 370 included in the sound input/output module 300 of FIG. 5 and FIG. 6 may be identical or similar to the frame 310, the speaker 330, and the microphone 370 included in the sound input/output module 300 of FIG. 3 and FIG. 4.

The printed circuit board 390, which an integral form of the first printed circuit board 350 and the second printed circuit board 390 of FIG. 3 and FIG. 4, may include a connection unit 391 for electrical connection with the sound processing module 230, and a circuit unit 393 which includes a circuit related to the signal processing of the microphone 370 and is electrically connected with a connection unit 331 of a speaker 330. According to an embodiment, the printed circuit board 390 may include a flexible printed circuit board.

The microphone 370 may be mounted on the circuit unit 393. For example, a via hole 395 may be formed in the circuit unit 393, and the microphone 370 may be mounted on a front surface of the circuit unit 393 at a position aligned with the via hole 395. At this time, a microphone hole 318 formed in the frame 310 may connect with the via hole 395.

The circuit unit 393 may be fixed to the frame 310. For example, a rear surface of the circuit unit 393 may be fixed to a second portion (a portion excluding a first portion of the front surface 311 on which the speaker seating part 314 is formed) of the front surface 311 of the frame 310 through an adhesive member (e.g., a double-sided tape). As another example, although not depicted, the circuit unit 393 may be fixed to the frame 310 through at least one hook portion (e.g., the hook portion 315 of FIG. 3 and FIG. 4) formed by protruding from the second portion toward the microphone 370. Also, the circuit unit 393 may be electrically connected to the connection unit 331 of the speaker 330. According to an embodiment, the connection unit 331 may be soldered to the circuit unit 393.

The microphone hole 318 and the speaker hole 316 shown in FIG. 5 and FIG. 6, which are not separated by a partition, may be connected with a space 317 formed between the speaker seating portion 314 formed in the frame 310 and the rear surface 312 of the frame 310 and connected with an external hole 257 through an acoustic hole 319 connecting with the space 317, thus reducing a clogging phenomenon due to a foreign substance introduced from the outside. In addition, a portion 301 where the microphone hole 318 and the space 317 are connected may have a bent shape, and this structure is a structure in which the microphone hole 318 is disposed as close as possible to a side surface of the frame 310, and may be a structure for securing the space 317 as much as possible. Thus, a volume of the space 317 may increase, and the mid- and high-range frequency output characteristics of the speaker 330 utilizing the space 317 as the resonance space may be improved.

Figure 7:
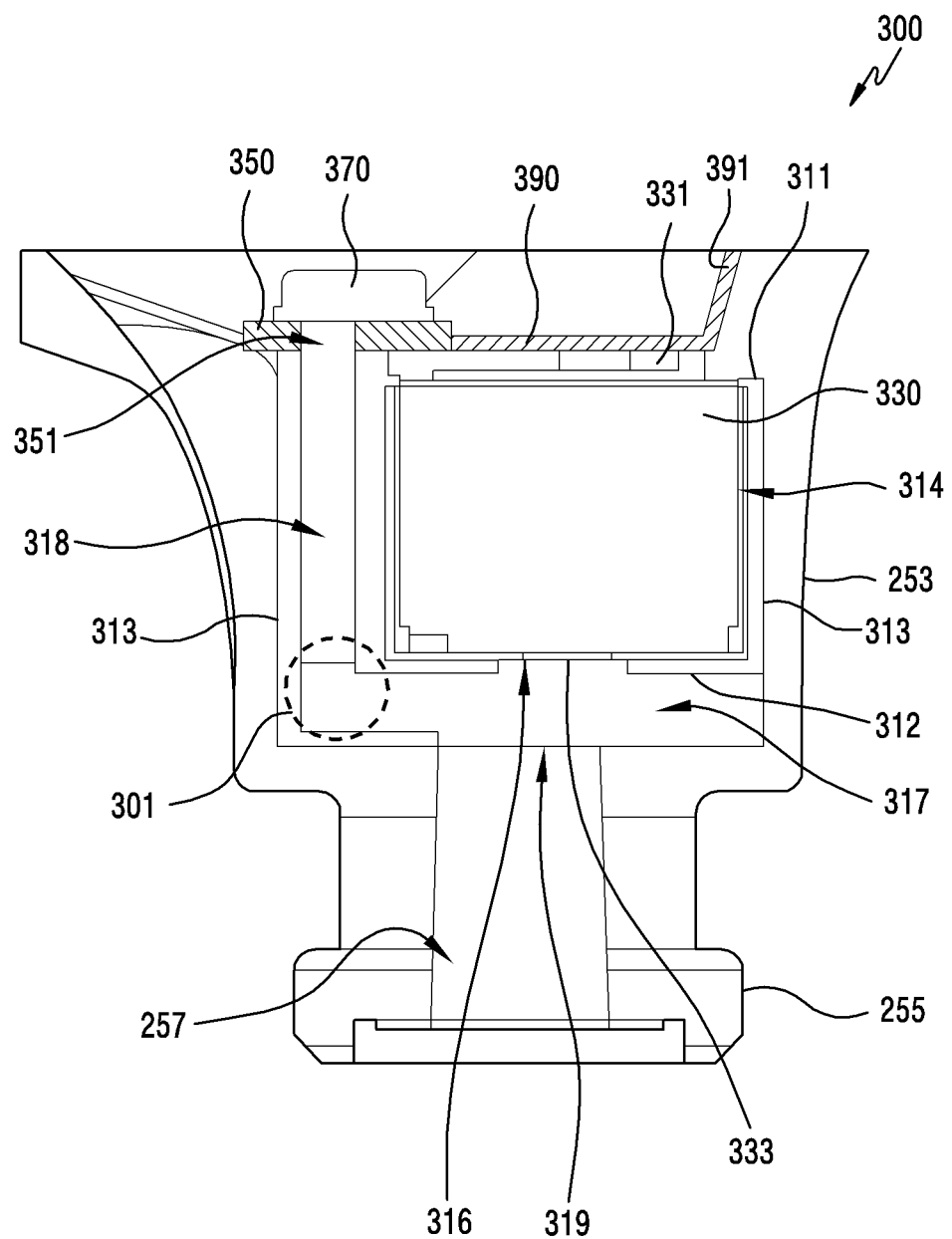
FIG. 7 is a cross-sectional view of a sound input/output module of a third aspect in which a speaker and a microphone are integrally formed according to an embodiment of the present invention.

FIG. 7 is a cross-sectional view of a sound input/output module of a third aspect in which a speaker and a microphone are integrally formed according to an embodiment of the present invention. A sound input/output module 300 shown in FIG. 7 may have a similar configuration to the sound input/output module 300 shown in FIG. 3 through FIG. 6. Descriptions on the similar configuration to FIG. 3 through FIG. 6 will be omitted in FIG. 7.

Referring to FIG. 7, the sound input/output module 300 may include a frame 310, a speaker 330, a first printed circuit board 350, a microphone 370 and a second printed circuit board 390. The speaker 330 and the microphone 370 included in the sound input/output module 300 of FIG. 7 may be identical or similar to the speaker 330 and microphone 370 included in the sound input/output module 300 of FIG. 3 through FIG. 6. In addition, the first printed circuit board 350 and the second printed circuit board 390 included in the sound input/output module 300 of FIG. 7 may be identical or similar to the first printed circuit board 350 and the second printed circuit board 390 included in the sound input/output module 300 of FIG. 3 and FIG. 4, and may be integrally formed like the printed circuit board 390 included in the sound input/output module 300 of FIG. 5 and FIG. 6.

The frame 310 included in the sound input/output module 300 of FIG. 7 may include a front surface 311, a rear surface 312, and a side surface 313 surrounding at least part of a space between the front surface 311 and the rear surface 312 similarly to the frame 310 included in the sound input/output module 300 of FIG. 3 through FIG. 6, and may include a speaker seating portion 314 recessed in a specific depth from a first portion of the front surface 311 toward the rear surface 312. If the frame 310 is seated on a seating portion 253 of the housing 250 in FIG. 7, the rear surface 312 of the frame 310 may not closely contact a lower end of an inner surface of the seating portion 253. Hence, a space 317 may be formed between the rear surface 312 and the lower end of the inner surface of the seating portion 253. The space 317 may be formed long from an inner surface of one side surface of the seating portion 253 to an inner surface of the other side surface. For example, a height of the space 317 may correspond to a distance between the rear surface 312 and the lower end of the inner surface of the seating portion 253, and a lateral length of the space 317 may be shorter than a width (a distance between the one side surface and the other side surface of the seating portion 253) of the seating portion 253, and longer than a horizontal distance between the microphone hole 318 and the speaker hole 316.

The frame 310 may include the speaker seating portion 314, a speaker hole 316 formed by penetrating from the speaker seating portion 314 to the space 317 through the rear surface 312, and a microphone hole 318 penetrated from a second portion (a portion excluding a first portion of the front surface 311 where the speaker seating portion 314 is formed) of the front surface 311 to the space 317. In addition, the acoustic hole 319 connecting with the external hole 257 may be formed by penetrating an inner surface of the seating portion 253 from the space 317.

Figure 8:
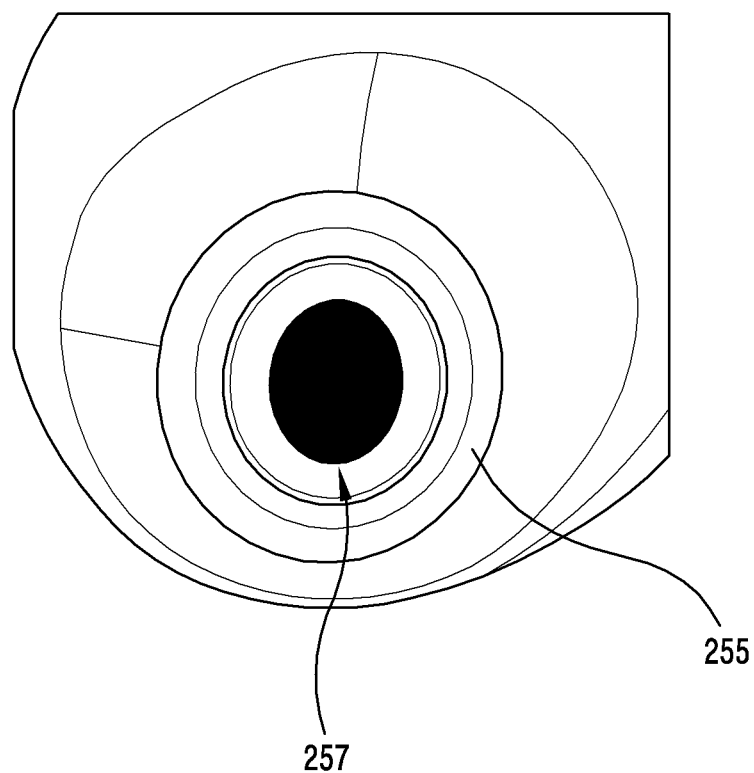
FIG. 8 is a view for illustrating a shape of an external hole of a headset according to an embodiment of the present invention.

FIG. 8 is a view for illustrating a shape of an external hole of a headset according to an embodiment of the present invention.

Referring to FIG. 8, a microphone hole 318 and a speaker hole 316 formed in a frame 310 of a sound input/output module 300, which are not separated by a partition, may connect with a space 317 formed between a speaker seating portion 314 formed in the frame 310 and a rear surface 312 of the frame 310. For example, an acoustic passage (a path of an output sound) of the speaker 330 and an acoustic passage (a path of a received sound) of the microphone 370 may be connected through the space 317. In addition, the space 317 may connect with one acoustic hole 319, and the one acoustic hole 319 may connect with an external hole 257 formed in a housing (e.g., the second housing 250) of the headset 200. At this time, one external hole 257 may also be formed in the housing to increase the cross-sectional area. Hence, the cross-sectional area of the external hole 257 and the acoustic hole 319 connecting with the external hole 257 is widened and a clogging phenomenon due to a foreign substance introduced from the outside through the external hole 257 may be reduced.

As set forth above, according to various embodiments, a headset (e.g., the headset 200, the electronic device 101) including an in-ear microphone may include, a first frame (e.g., the first frame 310) including a first surface (e.g., the front surface 311) toward a first direction, a second surface (e.g., the rear surface 312) toward a second direction opposite to the first direction, and a side surface (e.g., the side surface 313) surrounding at least part of a space between the first surface and the second surface, a speaker seating portion (e.g., the speaker seating portion 314) formed by recessing by a specific depth from a first portion of the first surface toward the second surface, a space (e.g., the space 317) formed between the speaker seating portion and the second surface, a speaker hole (e.g., the speaker hole 316) penetrated from the speaker seating portion to the space, a microphone hole (e.g., the microphone hole 318) penetrated from a second portion of the first surface to the space, an acoustic hole (e.g., the acoustic hole 319) formed by penetrating the second surface from the space, a speaker (e.g., the speaker 330) seated in the speaker seating portion, a first printed circuit board (e.g., the first printed circuit board 350) disposed on the second portion and having a via hole (e.g., the via hole 351) connected with the microphone hole, a second printed circuit board (e.g., the second printed circuit board 390) electrically connected with the first printed circuit board and a connection unit (e.g., the connection unit 331) of the speaker, and a microphone (e.g., the microphone 370) mounted at a position aligned with the via hole on the first printed circuit board.

According to various embodiments, the space may have a height may correspond to a distance between the speaker seating portion and the second surface, and a lateral length may be shorter than a width of the first frame and longer than a horizontal distance between the microphone hole and the speaker hole.

According to various embodiments, the microphone hole may be spaced from the speaker seating portion by a specific distance and formed in parallel with a surface of the speaker seating portion.

According to various embodiments, the microphone hole may be disposed within a designated distance from the side surface.

According to various embodiments, a portion (e.g., the portion 301) where the microphone hole and the space are connected may have a bent shape.

According to various embodiments, a horizontal distance between a central axis of the microphone hole and a central axis of the acoustic hole may be greater than a sum of a radius of the microphone hole and a radius of the acoustic hole.

According to various embodiments, the headset may further include at least one hook portion (e.g., the hook portion 315) formed by protruding from the second portion toward the microphone, and the first printed circuit board may be fixed to the first frame through the at least one hook portion.

According to various embodiments, the headset may further include a sound processing module (e.g., the sound processing module 230) including electronic components for processing a sound signal to be outputted to outside through the speaker and a sound signal inputted from the microphone, and electrically connected with the second printed circuit board, and a housing (e.g., the housings 210 and 250) for covering the first frame which includes the speaker, the microphone, the first printed circuit board, and the second printed circuit board and the sound processing module, wherein the housing may include a first seating portion (e.g., the first seating portion 251) in which the sound processing module is seated, and a second seating portion (e.g., the second seating portion 253) including an external hole (e.g., the external hole 257) which protrudes outwards from a surface of the housing and penetrates from the surface of the housing to the protruding end surface, and the acoustic hole may be connected with the external hole if the first frame is inserted and seated in the second seating portion.

According to various embodiments, the sound processing module may include a second frame (e.g., the frame 231) for receiving the electronic components and covering the electronic components, and the first frame and the second frame may be coupled to allow a central axis (e.g., the central axis 293) of the first frame and a central axis (e.g., the central axis 291) of the second frame to form a designated angle (e.g., the angle 295).

According to various embodiments, after the speaker, the microphone, the first printed circuit board, and the second printed circuit board are mounted in the first frame, the first frame may be inserted and seated in the second seating portion.

According to various embodiments, the first printed circuit board, and the second printed circuit board may be integrally formed.

As set forth above, according to various embodiments, a headset (e.g., the headset 200, the electronic device 101) including an in-ear microphone may include, a housing (e.g., the housings 210 and 250), a seating portion (e.g., the second seating portion 253) including an external hole (e.g., the external hole 257) which protrudes outwards from a surface of the housing and penetrates from the surface of the housing to the protruding end surface, a first frame (e.g., the frame 310) inserted and seated in the seating portion and including a first surface (e.g., the front surface 311) toward a first direction, a second surface (e.g., the rear surface 312) toward a second direction opposite to the first direction, and a side surface (e.g., the side surface 313) surrounding at least part of a space between the first surface and the second surface, a speaker seating portion (e.g., the speaker seating portion 314) formed by recessing by a specific depth from a first portion of the first surface toward the second surface, a space (e.g., the space 317) formed between a lower end of an inner surface of the seating portion facing the second surface and the second surface with the first frame seated, a speaker hole (e.g., the speaker hole 316) formed by penetrating from the speaker seating portion to the space through the second surface, a microphone hole (e.g., the microphone hole 318) penetrated from a second portion of the first surface to the space, an acoustic hole (e.g., the acoustic hole 319) formed by penetrating the inner surface of the seating portion from the space and connecting with the external hole, a speaker (e.g., the speaker 330) seated in the speaker seating portion, a first printed circuit board (e.g., the first printed circuit board 350) disposed on the second portion and having a via hole (e.g., the via hole 351) connected with the microphone hole, a second printed circuit board (e.g., the second printed circuit board 390) electrically connected with the first printed circuit board and a connection unit (e.g., the connection unit 331) of the speaker, and a microphone (e.g., the microphone 370) mounted at a position aligned with the via hole on the first printed circuit board.

According to various embodiments, the space may have a height may correspond to a distance between the lower end of the inner surface of the seating portion and the second surface, and a lateral length may be shorter than a width of the seating portion and longer than a horizontal distance between the microphone hole and the speaker hole.

According to various embodiments, the microphone hole may be spaced from the speaker seating portion by a specific distance and formed in parallel with a surface of the speaker seating portion.

According to various embodiments, the microphone hole may be disposed within a designated distance from the side surface.

According to various embodiments, a portion (e.g., the portion 301) where the microphone hole and the space are connected may have a bent shape.

According to various embodiments, a horizontal distance between a central axis of the microphone hole and a central axis of the acoustic hole may be greater than a sum of a radius of the microphone hole and a radius of the acoustic hole.

According to various embodiments, the headset may further include a sound processing module (e.g., the sound processing module 230) including electronic components for processing a sound signal to be outputted to outside through the speaker and a sound signal inputted from the microphone, and electrically connected with the second printed circuit board, the sound processing module may include a second frame (e.g., the second frame 231) for receiving the electronic components, covering the electronic components, and seated in an inner side of the housing, and the first frame and the second frame may be coupled to allow a central axis (e.g., the central axis 293) of the first frame and a central axis (e.g., the central axis 291) of the second frame to form a designated angle (e.g., the angle 295).

According to various embodiments, after the speaker, the microphone, the first printed circuit board, and the second printed circuit board are mounted in the first frame, the first frame may be inserted and seated in the seating portion.

According to various embodiments, the first printed circuit board, and the second printed circuit board may be integrally formed.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

The invention claimed is:

1. A headset comprising an in-ear microphone, comprising:
   a first frame comprising a first surface toward a first direction, a second surface toward a second direction opposite to the first direction, and a side surface surrounding at least part of a space between the first surface and the second surface;
   a speaker seating portion formed by recessing by a specific depth from a first portion of the first surface toward the second surface;
   a space formed between the speaker seating portion and the second surface;
   a speaker hole penetrated from the speaker seating portion to the space;
   a microphone hole penetrated from a second portion of the first surface to the space;
   an acoustic hole formed by penetrating the second surface from the space;
   a speaker seated in the speaker seating portion;
   a first printed circuit board disposed on the second portion and having a via hole connected with the microphone hole;
   a second printed circuit board electrically connected with the first printed circuit board and a connection unit of the speaker; and
   a microphone mounted at a position aligned with the via hole on the first printed circuit board.

2. The headset of claim 1, wherein the space has a height corresponds to a distance between the speaker seating portion and the second surface, and a lateral length is shorter than a width of the first frame and longer than a horizontal distance between the microphone hole and the speaker hole.

3. The headset of claim 1, wherein the microphone hole is spaced from the speaker seating portion by a specific distance and formed in parallel with a surface of the speaker seating portion.

4. The headset of claim 1, wherein the microphone hole is disposed within a designated distance from the side surface.

5. The headset of claim 1, wherein a portion where the microphone hole and the space are connected has a bent shape.

6. The headset of claim 1, wherein a horizontal distance between a central axis of the microphone hole and a central axis of the acoustic hole is greater than a sum of a radius of the microphone hole and a radius of the acoustic hole.

7. The headset of claim 1, further comprising:
   at least one hook portion formed by protruding from the second portion toward the microphone,
   wherein the first printed circuit board is fixed to the first frame through the at least one hook portion.

8. The headset of claim 1, further comprising:
   a sound processing module comprising electronic components for processing a sound signal to be outputted to outside through the speaker and a sound signal inputted from the microphone, and electrically connected with the second printed circuit board; and
   a housing for covering the first frame which comprises the speaker, the microphone, the first printed circuit board, and the second printed circuit board and the sound processing module,
   wherein the housing comprises:
   a first seating portion in which the sound processing module is seated; and
   a second seating portion comprising an external hole which protrudes outwards from a surface of the housing and penetrates from the surface of the housing to the protruding end surface, and
   the acoustic hole is connected with the external hole if the first frame is inserted and seated in the second seating portion.

9. The headset of claim 8, wherein the sound processing module comprises:
   a second frame for receiving the electronic components and covering the electronic components,
   wherein the first frame and the second frame are coupled to allow a central axis of the first frame and a central axis of the second frame to form a designated angle.

10. The headset of claim 8, wherein the first frame is inserted and seated in the second seating portion after the speaker, the microphone, the first printed circuit board and the second printed circuit board are mounted in the first frame.

11. The headset of claim 1, wherein first printed circuit board and the second printed circuit board are integrally formed.

12. A headset comprising an in-ear microphone, comprising:
- a housing;
- a seating portion comprising an external hole which protrudes outwards from a surface of the housing and penetrates from the surface of the housing to the protruding end surface;
- a first frame inserted and seated in the seating portion and comprising a first surface toward a first direction, a second surface toward a second direction opposite to the first direction, and a side surface surrounding at least part of a space between the first surface and the second surface;
- a speaker seating portion formed by recessing by a specific depth from a first portion of the first surface toward the second surface;
- a space formed between a lower end of an inner surface of the seating portion facing the second surface and the second surface with the first frame seated;
- a speaker hole formed by penetrating from the speaker seating portion to the space through the second surface;
- a microphone hole penetrated from a second portion of the first surface to the space;
- an acoustic hole formed by penetrating the inner surface of the seating portion from the space and connecting with the external hole;
- a speaker seated in the speaker seating portion;
- a first printed circuit board disposed on the second portion and having a via hole connected with the microphone hole;
- a second printed circuit board electrically connected with the first printed circuit board and a connection unit of the speaker; and
- a microphone mounted at a position aligned with the via hole on the first printed circuit board.

13. The headset of claim 12, wherein the space has a height corresponds to a distance between the lower end of the inner surface of the seating portion and the second surface, and a lateral length is shorter than a width of the seating portion and longer than a horizontal distance between the microphone hole and the speaker hole.

14. The headset of claim 12, wherein the microphone hole is spaced from the speaker seating portion by a specific distance and formed in parallel with a surface of the speaker seating portion.

15. The headset of claim 12, wherein the microphone hole is disposed within a designated distance from the side surface.

16. The headset of claim 12, wherein a portion where the microphone hole and the space are connected has a bent shape.

17. The headset of claim 12, wherein a horizontal distance between a central axis of the microphone hole and a central axis of the acoustic hole is greater than a sum of a radius of the microphone hole and a radius of the acoustic hole.

18. The headset of claim 12, further comprising:
- a sound processing module comprising electronic components for processing a sound signal to be outputted to outside through the speaker and a sound signal inputted from the microphone, and electrically connected with the second printed circuit board, and
- wherein the sound processing module comprises a second frame for receiving the electronic components, covering the electronic components and seated in an inner side of the housing, and
- wherein the first frame and the second frame are coupled to allow a central axis of the first frame and a central axis of the second frame to form a designated angle.

19. The headset of claim 12, wherein the first frame is inserted and seated in the seating portion after the speaker, the microphone, the first printed circuit board and the second printed circuit board are mounted in the first frame.

20. The headset of claim 12, wherein first printed circuit board and the second printed circuit board are integrally formed.

* * * * *